(12) United States Patent
Johnson et al.

(10) Patent No.: US 7,585,596 B1
(45) Date of Patent: Sep. 8, 2009

(54) MICRO-SCULPTING USING PHASE MASKS FOR PROJECTION LITHOGRAPHY

(75) Inventors: Eric G. Johnson, 1023 N. Division St., Oveldo, FL (US) 32765; Mahesh Pitchumani, Orlando, FL (US); Jin Won Sung, Orlando, FL (US); Heidi J. Hockel, Orlando, FL (US)

(73) Assignee: Eric G. Johnson, Harrisburg, NC (US)

( * ) Notice: Subject to any disclaimer, the term of this patent is extended or adjusted under 35 U.S.C. 154(b) by 710 days.

(21) Appl. No.: 10/961,928

(22) Filed: Oct. 8, 2004

Related U.S. Application Data

(60) Provisional application No. 60/511,795, filed on Oct. 16, 2003.

(51) Int. Cl.
*G03F 1/00* (2006.01)

(52) U.S. Cl. ............... 430/5; 430/311; 430/30
(58) Field of Classification Search ............ 430/5, 430/30, 311
See application file for complete search history.

(56) References Cited

U.S. PATENT DOCUMENTS

| 5,285,517 | A |   | 2/1994 | Wu ............... 385/142 |
| 5,413,884 | A | * | 5/1995 | Koch et al. ............ 430/5 |
| 5,415,835 | A | * | 5/1995 | Brueck et al. ........ 430/311 |
| 5,482,800 | A |   | 1/1996 | Gal ............... 430/5 |
| 5,786,116 | A | * | 7/1998 | Rolfson ............ 430/5 |
| 5,972,542 | A | * | 10/1999 | Starodubov ............ 430/5 |
| 6,013,396 | A | * | 1/2000 | Capodieci ............ 430/5 |
| 6,057,065 | A | * | 5/2000 | Rolson ............ 430/5 |
| 6,071,652 | A |   | 6/2000 | Feldman et al. ............ 430/5 |
| 6,214,495 | B1 | * | 4/2001 | Segawa et al. ............ 430/5 |
| 6,420,073 | B1 |   | 7/2002 | Suleski et al. ............ 430/5 |
| 6,524,756 | B1 |   | 2/2003 | Wu ............... 430/5 |
| 6,562,523 | B1 |   | 5/2003 | Wu et al. ............ 430/5 |
| 6,613,498 | B1 | * | 9/2003 | Brown et al. ............ 430/322 |
| 6,638,667 | B2 |   | 10/2003 | Suleski et al. ............ 430/5 |
| 2003/0096176 | A1 | * | 5/2003 | Miyamae et al. ............ 430/5 |

* cited by examiner

*Primary Examiner*—Mark F Huff
*Assistant Examiner*—Stewart A Fraser
(74) *Attorney, Agent, or Firm*—Brian S. Steinberger; Phyllis K. Wood; Law Offices of Brian S. Steinberger, P.A.

(57) ABSTRACT

Methods and systems of creating a photo-mask to form continuous relief micro-structures in photo-active material. This technology uses a basic amplitude mask or electron-beam to create a binary phase grating with pi-phase depth on a transparent reticle coated with photo-active material. The reticle is then used as a phase mask for the fabrication of analog micro-elements. The mask is used in an image reduction machine such as an optical stepper. The period and duty cycle of the phase gratings can be varied to create the proper analog intensity for the desired micro-profile on the photo-active material. The design, analysis, and fabrication procedure of this invention for prisms and positive micro-lenses has been demonstrated.

31 Claims, 11 Drawing Sheets

Figure 14a
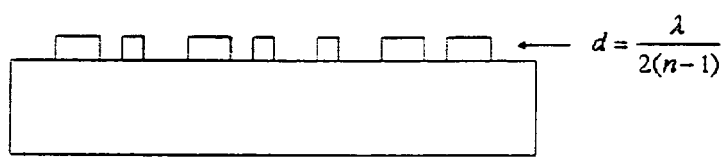
$d = \dfrac{\lambda}{2(n-1)}$
Figure 14b
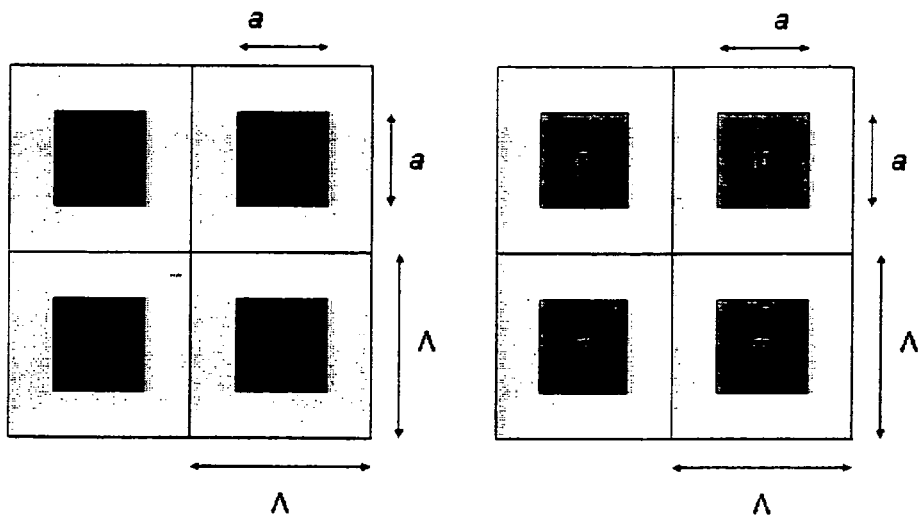
Figure 15a
Figure 15b

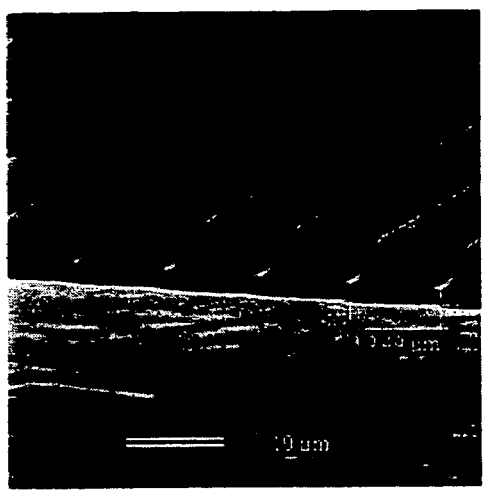 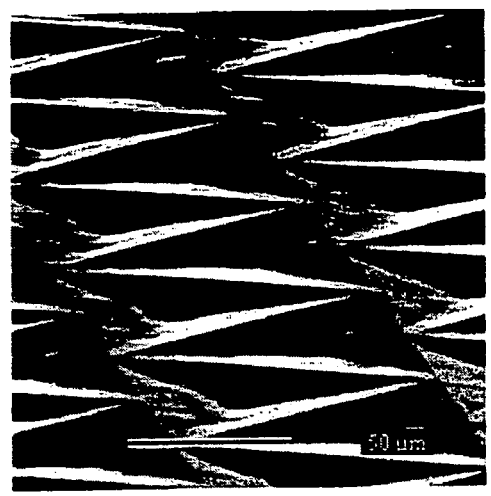
Figure 16
Figure 17

MICRO-SCULPTING USING PHASE MASKS FOR PROJECTION LITHOGRAPHY

This invention claims the benefit of priority to U.S. Provisional Application 60/511,795 filed Oct. 16, 2003.

FIELD OF USE

This invention relates to photo masks, in particular to methods and systems for phase mask fabrication of analog micro-optics, micro-fluidic devices, micro-electro-mechanical systems (MEMS), and other passive alignment structures.

BACKGROUND AND PRIOR ART

In the field of micro-optics, refractive elements such as micro-lenses are difficult to fabricate using photolithographic techniques. Photolithography has been developed primarily for fabricating binary structures in photo-resist; that is, structures with substantially two distinctive heights or levels: in the case of a positive photo-resist, this results in a lower level where the photo-resist was removed, and an upper level where the remaining photo-resist material covers the substrate. The binary type of resist profile has been researched and optimized extensively for the last twenty years in order to reach the highest possible level of resolution, but such a conventional photolithographic process is unsuitable for the continuous relief profiles required for refractive micro-optics elements. In the micromachining of micro-optics, a special technique is required to create continuous resist profiles for analog micro-optical elements such as micro-lenses and prisms.

Fabrication techniques recently developed for large analog resist profiles in thick photo-resist include gray-scale, half-tone, and binary phase mask technology. But current techniques available for fabricating analog micro-optics are both costly and highly specific to each element and application.

Various prior art patents have been proposed in this field. See for example, U.S. Pat. Nos. 5,482,800; and 6,613,498. U.S. Pat. No. 5,285,517 describes high energy beam sensitive glasses. U.S. Pat. No. 6,562,523 describes a direct write all-glass photomask blanks technique. U.S. Pat. Nos. 6,071,652; 6,420,073; 6,524,756, and 6,638,667 deal with the gray-level mask. None of these patents overcomes the problems with the prior art.

The gray-scale mask provides analog optical transmittance with continuously varying optical density. Gray-scale masks utilize the properties of a high-energy beam sensitive (HEBS) glass plate in order to form continuous relief profiles in the photo-resist. Gray-scale masks have two main drawbacks: high cost and strict dependence on the optical density of the photo-resist being used. It is necessary to characterize the thickness of the resist in terms of the optical density for a specific exposure tool in order to design a proper optical density map on a gray-scale mask.

Half-tone masks create analog optical transmittance by use of a square dot array representing continuous optical density. By varying the pixel density or size, half-tone masks are capable of creating analog optical transmittance for the incident exposure light. However, this technique suffers from the pixel aperture diffraction effect, and also requires the adjustment of pixel density for a specific exposure tool. Half tone techniques have various other problems such as more light being diffracted resulting in more noise in the image plane. Furthermore, the depth of focus is limited.

The concept of utilizing alternating phase shift on the photo-mask first came up in the late 1980s as a technique of enhancing resolution by overcoming the diffraction limit of the imaging system. The pure phase mask does not cause the light to scatter due to the edge diffraction as half-tone masking does. The phase shift mask has become a mature, standard technique for resolution enhancement in the semiconductor industry, and is mainly used for dense periodic patterns of sub-micron resolution. The phase shift is usually implemented in the alternating opening region of a binary amplitude chrome mask by etching the mask substrate for a phase shift of half wavelength. A pure binary phase mask is sometimes used for fabricating high frequency sinusoidal gratings in the photo-resist with half period of the mask. However, the phase grating mask technique has not been used for creating analog resist profiles as have gray-scale and half-tone mask techniques. This technique is restricted to resolution enhancement for binary patterns and is not suited for the fabrication of analog resist profiles.

Thus, there exists a need for a method to fabricate large analog resist profiles in a variety of both thin and thick photo-active polymers for the fabrication of refractive micro-elements using projection systems at a variety of wavelengths that solves the problems of the prior art.

SUMMARY OF THE INVENTION

The first objective of the present invention is to provide a method and system of micro-sculpting, using phase masks in an optical image reduction machine, that is based on simple phase mask technology by which a photo-mask is fabricated and is then used to image a variable intensity pattern onto the photo-active material of a target with improved depth of focus.

The second objective of the present invention is to provide a method and system of micro-sculpting using phase masks in optical steppers that use a phase mask vs. half-toning or variable amplitude which improves on current techniques by increasing flexibility and decreasing cost.

The third objective of this invention is to provide a method and system of micro-sculpting using phase masks in optical image reduction machines, such as steppers, that result in a larger depth of focus in the image plane, less scattering of the light, and can utilize conventional lithography fabrication techniques.

The fourth objective of the present invention is to provide a method and system of micro-sculpting using phase masks in optical image reduction machines that can use additive lithography to fabricate the phase function on the mask for subsequent exposures on the wafer for complex micro-sculpting.

The fifth objective of the present invention is to provide a method and system of micro-sculpting using phase masks in optical image reduction machines that can be used for the fabrication of micro-optics, micro-fluidic devices, micro-electro-mechanical systems (MEMS), and other passive alignment structures based on micromachining, biochips, and similar.

According to the present invention, a new photo-mask technology is capable of forming a continuous relief analog profile on photo-active material of varying thickness. This technique eliminates many of the drawbacks of gray-scale and half-tone masking technology. This technique is fundamentally different from the gray-scale and half-tone mask techniques in that it utilizes a phase function on the mask plane to create analog optical intensity on the wafer plane, while the other two techniques only exploit analog amplitude functions on the mask plane. Numerous methods of lithography, including projection, contact, and electron beam direct writing can be used to fabricate binary phase gratings of pi phase depth on a transparent reticle. If the period of the phase grating is small enough to prevent first and higher order diffracted light from passing through the imaging system of the image reduction machine, the optical intensity on the wafer plane can be controlled. When the phase-mask reticle is used in the image reduction machine, an analog intensity profile is created on the wafer. The period is constrained allowing for control of the $0^{th}$ order diffraction in the image reduction machines. The duty cycle of the phase gratings can be varied in such a way as to provide the proper analog intensity profile for a wide range of three-dimensional surfaces on the photo-active material.

The optical transmittance of the phase mask can be controlled in a continuous fashion by changing the parameters of the binary phase grating. Using only the $0^{th}$ order diffraction from the phase grating with a pi phase shift, the optical transmittance can be controlled by simply varying the duty cycle of the phase grating. By designing a binary phase grating mask with a varying duty cycle in such a way that it creates the desired analog optical intensity, then exposing the target with this phase mask, an analog profile can be formed in the photo-active material on the target. By using a binary phase grating mask in an optical image reduction machine, the analog optical intensity on the wafer allows for the fabrication of a variety of diffractive and refractive elements that provide for pattern variation at a much lower cost.

Further objects and advantages of this invention will be apparent from the following detailed description of the presently preferred embodiments which are illustrated schematically in the accompanying drawings.

BRIEF DESCRIPTION OF THE FIGURES

FIG. 14a shows an opaque chrome layer on the photomask.

FIG. 14b shows a binary phase grating mask layer on the photomask.

FIG. 15a shows the half-tone mask for analog resist profile formation.

FIG. 15b shows the binary phase grating mask for analog resist profile formation.

FIG. 16 is an SEM image of a blazed grating.

FIG. 17 is an SEM image of a trihedral array.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

Theoretical Background

Figure 1:
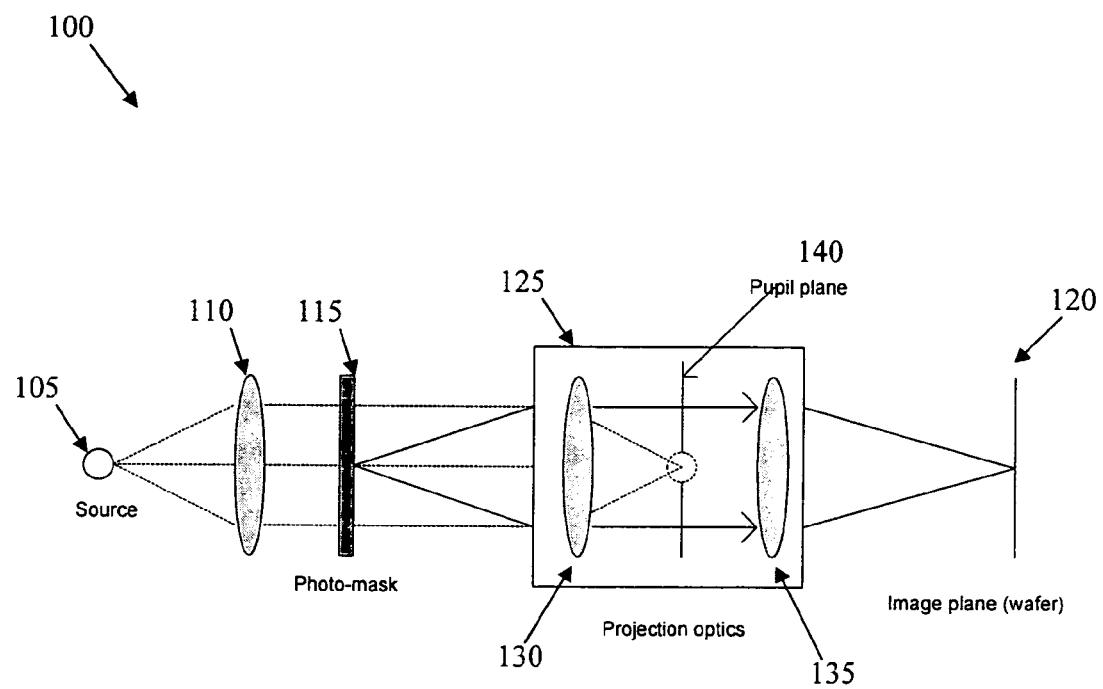
FIG. 1 shows the optical layout of the stepper.

Referring now to FIG. 1, the optical stepper 100 being used in photolithography is a reduction optical imaging system combined with a partially coherent illuminating source 105. The condenser unit 110 provides collimated exposure light to the photo-mask 115, which is in the object plane of stepper 100. The exposing light is diffracted by the mask 115 and imaged through the stepper 100 onto the image plane on the wafer 120. The reduction ratio of this imaging is often 5×, which means that features on the wafer are five times smaller than the corresponding objects on mask. The imaging part 125 of the stepper 100 consists of two major lens groups 130, 135; one lens group 130 faces the mask object 115 and one lens group faces the wafer 120. In between the two lens groups 130, 135, there is a pupil plane 140 where the Fourier spectrum of the mask object is formed.

Figure 2A:
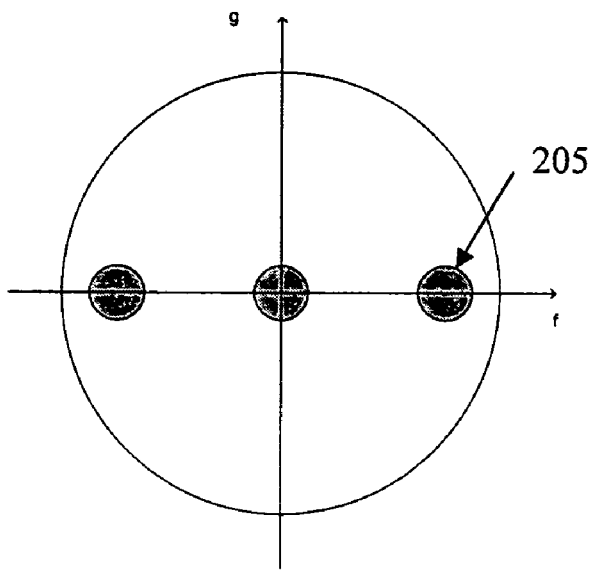
FIG. 2a shows the pupil diagram of the mask spectrum of binary amplitude grating.

It is convenient to represent this pupil plane 140 with the spatial frequency coordinate. The radius of the pupil is determined by the numerical aperture (NA) of the imaging system. In the case of a conventional binary amplitude grating mask, there will be several diffraction spots with the $0^{th}$ order at the center of the pupil plane and symmetric higher order spots on the left and right side, as shown in FIG. 2a.

The separation distance between the diffracted orders depends on the period of the grating object on the mask, and is given as $$\Delta f = \frac{1}{p} \tag{1}$$

Where p is the period of grating object on the mask, and the radius of the pupil is given as NA/λ. So, by equating these two quantities, the cut-off period below which all ±1 and higher diffracted orders from the pupil area are eliminated is given by $$p_c = \frac{\lambda}{NA(1+\sigma)} \tag{2}$$

Figure 2B:
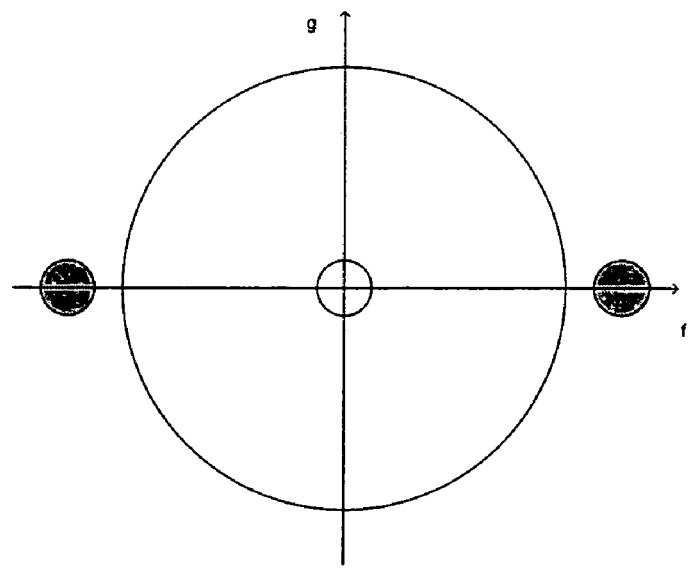
FIG. 2b shows the pupil diagram of the binary phase grating with pi phase shift and sufficiently small period.
Figure 3:
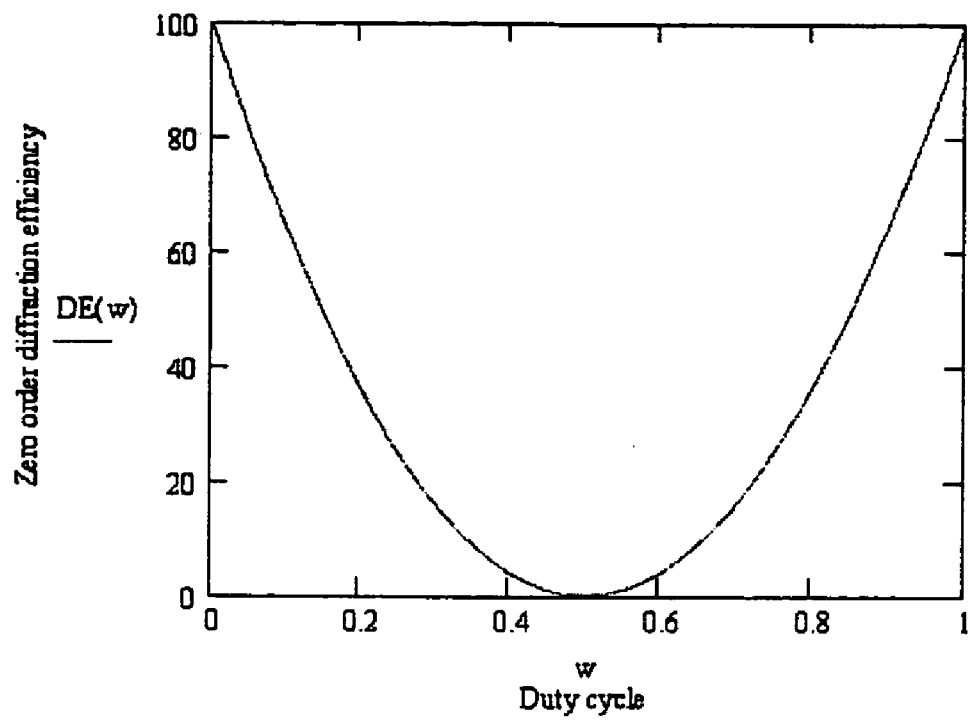
FIG. 3 shows the $0^{th}$ order diffraction efficiency of binary phase grating of pi phase depth as a function of duty cycle.

In the above expression, the quantity σ is a partial coherence factor that accounts for the finite size of the condenser source 110. It is defined as the ratio of the condenser numerical aperture to the imaging numerical aperture. Its value is usually between 0 and 1, and a smaller value corresponds to a more coherent source. Below the cut-off period, the binary amplitude grating would not form an image on the wafer because there is only uniform $0^{th}$ order diffracted light intensity. For the gray-scale or half-tone mask which produces an analog amplitude, the Fourier spectrum on the pupil plane 140 would have some arbitrary analog pattern filling the entire pupil area rather than the discrete diffraction spots 205, and there is no way to modify this frequency spectrum pattern at the pupil plane. This frequency filtering effect at the pupil is a fundamental property of the optical stepper 100, which also sets the resolution limit on the feature size. However, if one can make the diffraction efficiency of the $0^{th}$ order as a function of the position on the reticle, then this frequency filtering effect can be utilized to create an analog optical intensity with only $0^{th}$ order diffracted light from the mask. This can be achieved with a binary phase grating mask with pi phase depth. In this case, the even orders of diffraction spots would not exist if the duty cycle of the grating is approximately 0.5 as shown in FIG. 2b. The duty cycle of a grating in one dimension is defined as the ratio of line-width to the period. The diffraction efficiency of this type of grating would be a function of duty cycle. From the scalar diffraction theory, the $0^{th}$ order diffraction efficiency of this binary phase grating is given as $$DE_0(x) = 1 - 4(w(x)/p) + 4(w(x)/p)^2 \quad (3)$$

Where p is the period and w is the width of grating line which can be varied as a function of position on the reticle plane. At the half duty cycle w becomes p/2, and the diffraction efficiency becomes zero. But, as w departs from the half duty cycle, the value of $DE_0$ begins to rise in the form of a parabolic function as shown in FIG. 3.

Figure 4:
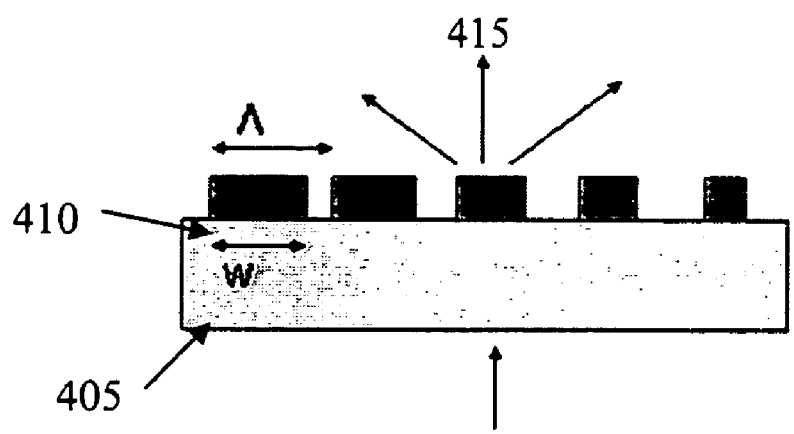
FIG. 4 shows the binary phase grating mask with spatially varying duty cycle.

Referring now to FIG. 4, by varying the line width w 410 as a function of position on the reticle 405, the exposure intensity 415 passing through the reticle 405 would also be a function of position on the reticle 405. Therefore, it is possible to create any arbitrary analog exposure intensity by designing the appropriate duty cycle function D(x, y)=w(x, y)/p for the binary phase grating mask. The diffraction efficiency of equation (3) can be used as the desired target intensity I(x, y), coming out of the reticle 405. The duty cycle, D(x, y)=w(x, y)/p, can then be stated as $$D(x, y) = \frac{1}{2}\left(1 - \sqrt{I(x, y)}\right) \quad (4)$$

By knowing the desired analog intensity, I(x, y), for a certain element, it is possible to design a phase grating with the corresponding duty cycle.

This principle can be generalized to two dimensional profile problems. The optical amplitude transmittance for the two dimensional square binary phase grating can be expressed as simply the product of the amplitude function for x direction and the other for y direction. Therefore, the zero order diffraction efficiency can be expressed as $$DE_0(x,y) = (1 - 4w_x(x)/p_x + 4(w_x(x)/p_x)^2) \cdot (1 - 4w_y(y)/p_y + 4(w_y(y)/p_y)^2) \quad (5)$$

Where $(w_x, p_x)$, $(w_y, p_y)$ are the duty cycle and period for x and y direction respectively.

Thus, a desired intensity I(x, y) can be written as $$I(x,y) = I_1(x) I_2(y) \quad (6)$$

The duty cycle function of both x and y direction can be stated as $$D_x(x) = \frac{1}{2}\left(1 - \sqrt{I_1(x)}\right) \quad (7a)$$

$$D_y(y) = \frac{1}{2}\left(1 - \sqrt{I_2(y)}\right) \quad (7b)$$

Using the above relations, it is possible to design two-dimensional phase gratings in order to fabricate two-dimensional analog elements.

Photo-Resist Characterization for the Binary Phase Grating Mask

Figure 5A:
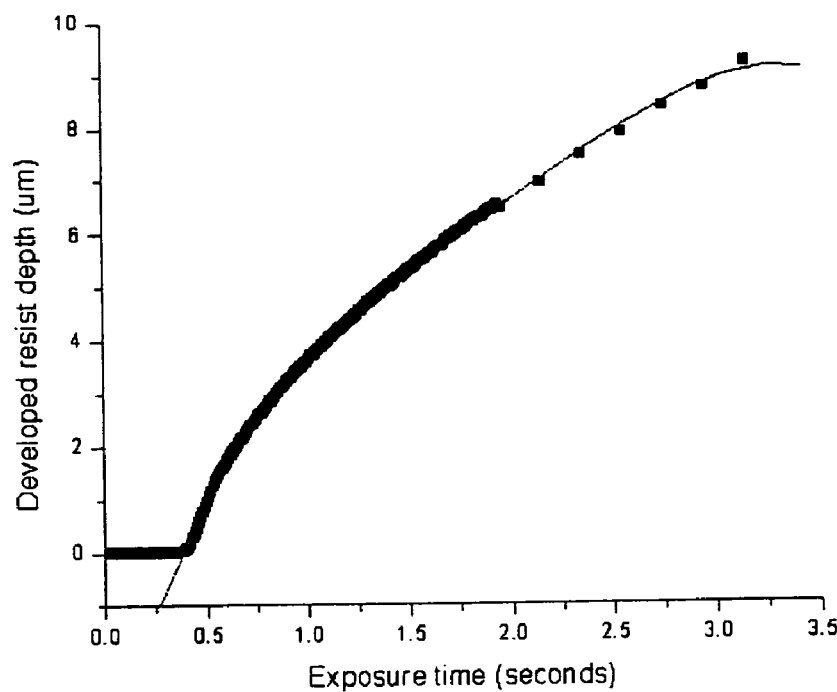
FIG. 5a shows a graph of the experimental developed depth vs. exposure time of SPR220 photo-resist.
Figure 5B:
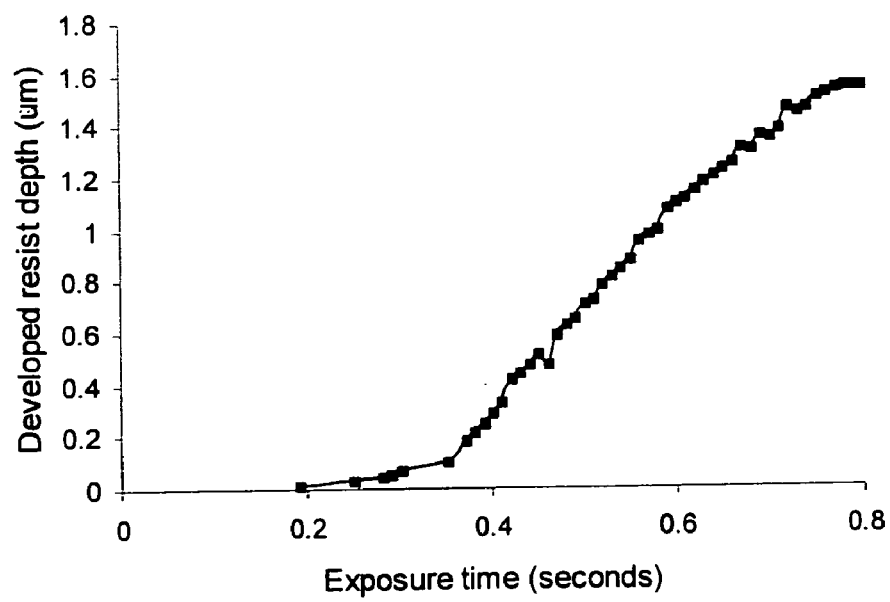
FIG. 5b shows a graph of the experimental developed depth vs. exposure time of 1813 photo-resist.

In order to determine the desired analog intensity for a given micro-optics profile on the surface of the photo-resist, one needs to know how the variation of duty cycle translates to the height variation of photo-resist. In general, the developed photo-resist depth is a nonlinear function of exposed dose and should be characterized experimentally for the specific photo-resist to be used for making the analog profile. Shipley SPR220, a positive photo-resist, was used on a GCA g-line stepper to verify and demonstrate the phase mask technique. FIG. 5a shows the experimental characteristic curve of SPR220 resist for the region of interest. FIG. 5b shows a similar curve for Shipley 1813.

The analog optical transmittance from this type of binary phase mask would provide an analog dose to the photo-resist. The final resist profile after development would then be the result of the convolution of intensity vs. duty cycle curve with the characteristic resist depth vs. dose curve. Since the dose is simply the product of image intensity and exposure time, the two curves can be combined for a specific exposure time to obtain final resist height as a function h(w) of duty cycle, w. This curve can be represented as a quadratic function h(w) of duty cycle. By solving it for w(h), an expression of duty cycle as a function of resist height h is obtained. The duty cycle function D(x, y) for a certain resist height profile h(x, y) is simply $$D(x,y) = w(h(x,y)) \quad (8)$$

This duty cycle function is used to design a binary phase grating mask for a certain analog micro-optics profile.

A phase mask was fabricated to characterize the photo-resist in terms of the duty cycle of the phase grating and obtain an experimental resist characteristic curve. As evident from the curve shown in FIG. 5a, it is necessary to first do a blank exposure between approximately 0.5 and approximately 1.0 seconds for SPR220 to reach a region of nearly linear response to exposure time. This first exposure, known as a bias exposure, was performed without a mask. After the bias exposure, the photo-resist was exposed with the $0^{th}$ order diffracted light that passed through the phase grating mask and stepper. Since the intensity of this $0^{th}$ order imaging light is linearly proportional to the duty cycle, the variation of duty cycle on the phase grating mask would result in nearly linear variation of developed resist depth. For an approximately 9 μm thickness of SPR 220, the curve of thickness vs. duty cycle was obtained using this phase mask with bias exposure of 1 sec. This curve agrees with the theoretical curve within the error of approximately 5% and was fit to a quadratic curve to obtain an expression for the duty cycle, w, as a function of the resist height, h, as explained earlier for equation (8).

Fabrication of Micro-Lenses Using Binary Phase Grating Mask

Figure 6:
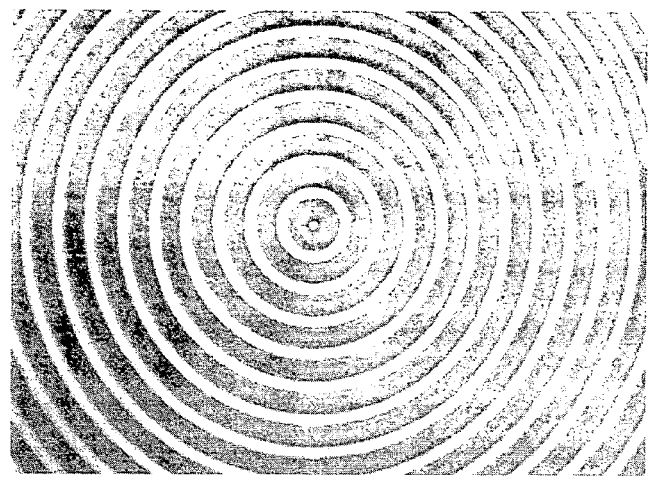
FIG. 6 shows the one dimensional phase grating for a 100 μm spherical micro-lens.

Using the experimentally determined relation of duty cycle and resist height, a circular phase grating mask was designed and fabricated for the fabrication of micro-lenses with diameter of approximately 100 μm. The period of the final phase mask pattern was designed to be approximately 3.0 μm, less than the cut off period for the GCA stepper (approximately 3.5 μm). The dimensions of the necessary mask patterns were then determined to account for the 5× scaling of the wafer stepper. The phase mask was fabricated in Shipley 1805 photo resist on a transparent plate with pi-phase depth by exposing a chrome amplitude mask. The one dimensional design shown in FIG. 6 utilizes a changing line width to control the duty cycle.

Figure 7A:
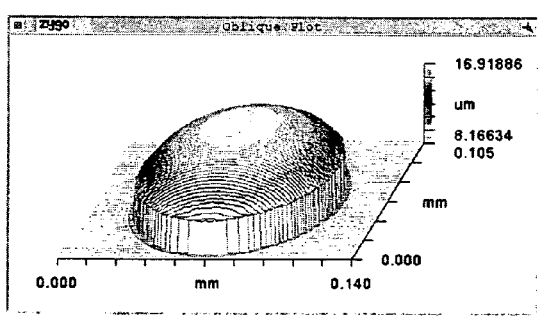
FIG. 7a shows a two dimensional profile of a spherical micro-lens fabricated in SPR220 photo-resist.
Figure 7B:
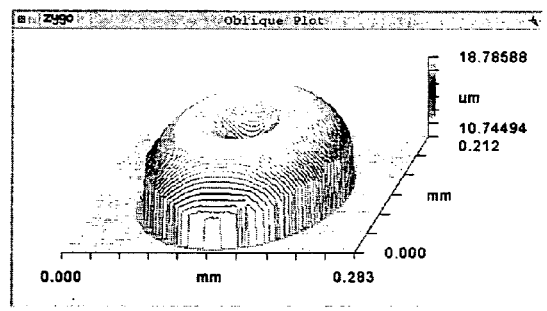
FIG. 7b shows a two dimensional profile of a ring lens fabricated in SPR220 photo-resist.

The fabricated binary phase grating mask was used to expose fused silica wafers coated with an approximately 9 μm thick MEGAPOSIT SPR220 photo-resist. The refractive micro-lens profiles are formed on the surface of the photo-resist after the development process. The surface profiles were measured with a Zygo white light interferometer and are shown in FIGS. 7a-7b. FIG. 7a shows the measured profile of a positive lens with sag of Xμm. FIG. 7b shows the measured profile of a ring lens.

Figure 8A:
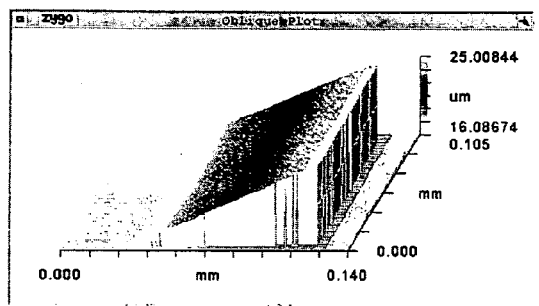
FIG. 8a shows a two dimensional profile of a micro-prism fabricated in SPR220 photo-resist.
Figure 8B:
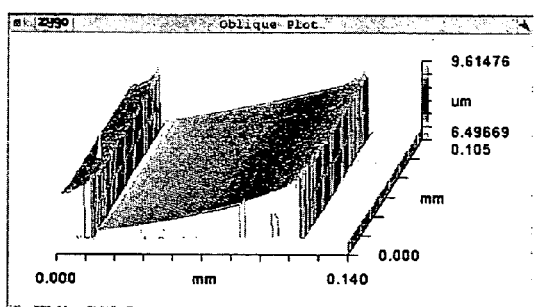
FIG. 8b shows a two dimensional profile of a micro-prism fabricated in Shipley 1813 photo-resist.

By varying the exposure dose, resist thickness, or even resist type, lenses with varying amounts of sag are easily fabricated. A variation in sag from approximately 500 nm to approximately 9 μm was fabricated by changing the dose or resist type only, while the mask itself remains the same. FIG. 8a shows a micro-prism fabricated in SPR 220. FIG. 8b used the same mask to fabricate a micro-prism in approximately 1.5 um thick Shipley 1813 photo-resist.

Figure 8C:
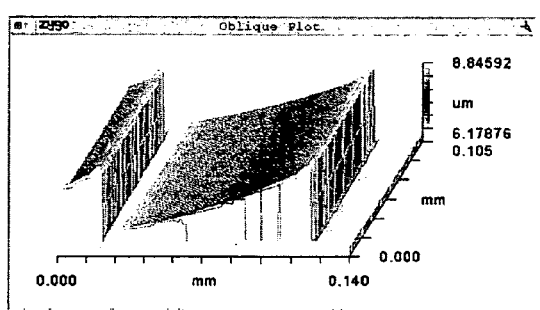
FIG. 8c shows a two dimensional profile of a micro-prism etched into a fused silica substrate.

After developing the photo-resist, the element was then transferred to the substrate using a dry etch step. FIG. 8c shows the positive lens in quartz. Using different etch recipes and chemistries, both wet and dry, allows for additional variability when transferring the patterns. Utilizing a high or low selectivity etch, it is possible to further tailor the profile of the element.

The phase mask technique is an extremely efficient alternative for the fabrication of refractive profiles with smooth variations in height. It is evident from FIGS. 8a-8b that this technique is not constrained by the type or thickness of photo-resist used as is the case with the previous techniques.

Fabrication of Complex Elements Using Binary or Multilevel Phase Masks

Micro-lens arrays are used heavily in photonics and other areas of research. There is a continuous investigation into efficiently and cost effectively fabricating these arrays. Using a simple grating pattern on a chrome mask, it would be possible to step either the same or varying (positive-negative) pattern along a coated reticle. When using that reticle to expose the wafer, the result would be a tightly packed array of lenses. These arrays could also be stepped along the wafer to further increase the number of micro-lens arrays on the final product.

Analog micro-optical elements such as lenses, prisms and gratings have been effectively fabricated using binary phase masks. When the desired elements become more complicated, however, multilevel masks will be beneficial to achieving the final design. In order to fabricate the multilevel phase mask, the Additive Method of Photolithography may be used. Other techniques for multilevel patterns require intermediate etch steps, which would require a new reticle for every pattern. By eliminating the etching, it is possible to use the same reticle for a variety of patterns. The additive method constrains all alignment of the levels within the tolerance of the stepper system itself, allowing for sufficiently aligned optics that can then be placed in the system and when illuminated, create complex yet smooth patterns.

Binary or multilevel phase masks may be used in combination to create uniquely sculpted features. Many times it is more efficient to create the refractive lenses, and then add the variations in a separate step. Using this technique, it is possible to create arrays of lenses by stepping the grating pattern across the phase mask. When the mask is exposed, a tightly packed array of lenses will be exposed on the wafer. A variety of elements can be implemented in tightly packed arrays, many of which are simple grating, trihedral or lens arrays. At the same time, alignment marks would also be patterned on the wafer. After developing, the wafer would be coated again with photo-resist, and using the alignment marks, additional patterns would be added to the lenses. These elements can be either analog or binary, and can be patterned on the same system, or using another method of lithograpy. This multiplexing of elements could also take place without the additional resist layer, by simply splitting the exposure dose to the initial substrate for two subsequent exposures of varying patterns.

The phase mask technique is an extremely efficient alternative for the fabrication of refractive profiles with smooth variations in height. With a period small enough to cut off diffracted light higher than the $0^{th}$ order, one can simply vary the duty cycle on the mask plane to produce the desired analog intensity. This property is ideal for fabricating analog photo-resist profiles with a photolithographic stepper system. This technique utilizes a flat bias exposure and only one exposure with the phase only mask, eliminating the complicated steps and alignments associated with other techniques. The phase mask is also free from the edge scattering effect which occurs at the sharp boundary of the chrome and open region on half-tone masks. This technique has been demonstrated for positive micro-lenses and prisms but can be utilized for a plethora of other analog micro-optics patterns. The ability to repeatedly fabricate three-dimensional elements that match the numerical design with excellent surface quality was shown using this phase-mask technique.

Micro-sculpting using phase masks for projection lithography has proven to be a viable alternative to the gray scale and half tone amplitude masking techniques. As disclosed in the preferred embodiment of the present invention, a phase mask, with grating features in one or two dimensions fabricated at a phase thickness which is an integer multiple of pi, is required for the success of the analog micro-optics fabrication technique. There are numerous ways to produce this phase mask, including exposure on a stepper, contact exposure, and e-beam direct write. Each of these techniques respectively correlates to better quality and reduced critical dimension phase masks. The variation in phase mask fabrication allows for those in any typical photolithographic setting to tailor and optimize the process to fit their needs. By utilizing different projection systems, post-processing steps, or types and thicknesses of photo-active polymers it is possible to further extend the variability of micro-sculpting using phase masks.

In a second embodiment of the present invention, a two-dimensional phase grating mask with pi phase depth can produce a desired analog variation of exposure intensity over symmetric and non-symmetric topographies. This allows one to form an analog photo-resist thickness variation after exposure with a photolithographic stepper and photo-resist development. A two-dimensional phase grating mask of square pixels was simulated, designed, and fabricated. The fabrication of analog micro-optics in thin and thick photo-resist using this phase-mask was also demonstrated.

Phase-mask technology has been used in photolithography for more than a decade at semiconductor manufacturing plants to enhance the resolution of the optical stepper beyond the classical diffraction limit. To date, however, it has not been utilized to create analog exposure intensity for resist profiles. The possibility of a phase only photo-mask creating analog optical transmittance suitable for analog photo-resist profile fabrication with a stepper was investigated. The pure phase-mask does not cause the scattered light due to edge diffraction as half-tone masking does. With a one-dimensional binary phase grating with pi phase depth on the mask, the $0^{th}$ order diffraction efficiency is zero at half duty cycle. At other duty cycles, the $0^{th}$ order efficiency is a function of that duty cycle. If the period of the phase grating is small enough to prevent first and higher orders from passing through the imaging system of the stepper, the optical intensity on the wafer plane can be controlled by simply varying the duty cycle of the phase grating. The cutoff period for a stepper with a 5× mask scale is calculated by the following formula.

$$p_c = \frac{M\lambda}{NA(1+\sigma)} \quad (10)$$

In the above expression, the symbols M, λ, NA, car are the image reduction factor, wavelength, numerical aperture and partial coherence factor of the stepper respectively. For the G-line (436 nm) stepper used in this work, the values of those parameters are approximately 5, approximately 0.35, approximately 0.436 μm, approximately 0.6 resulting in a cutoff period of approximately 3.89 μm. A binary phase mask with varying duty cycle was designed in such a way as to create the desired analog optical intensity. This mask was then exposed with a stepper resulting in the formation of an analog surface profile in thick (>approximately 5 μm) photo-resist.

Figure 9:
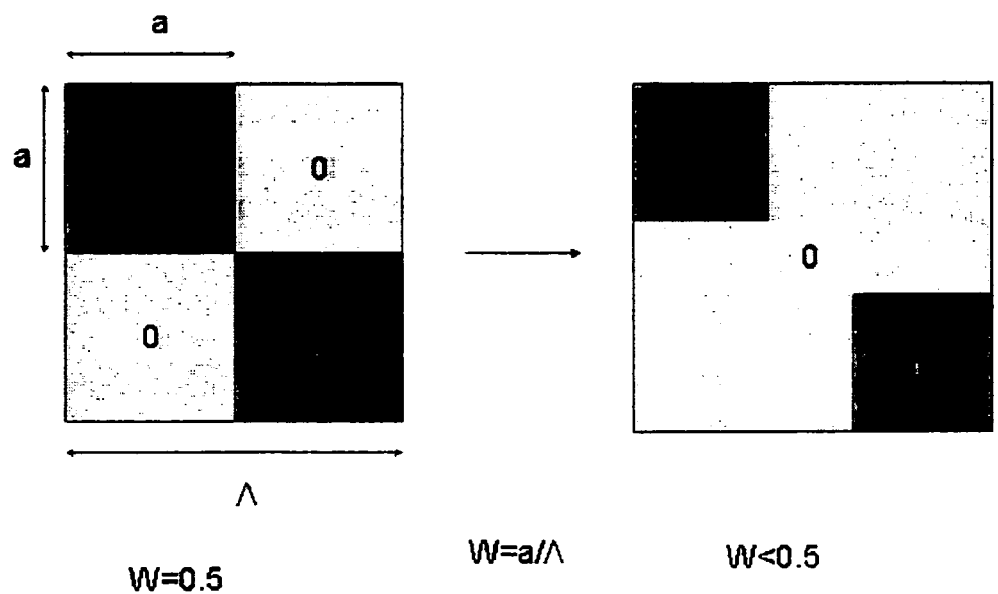
FIG. 9 shows the single period design of two different duty cycles for the phase grating mask.

In order to design the binary phase mask for an arbitrary two dimensional resist profile, a two dimensional phase grating with a pitch (unit cell) shape that creates sufficient variation of efficiency was designed by changing the fill factor. The fill factor is defined as the ratio of pi phase area to the entire pixel area. An aerial imaging intensity computation code based on the scalar diffraction and the transfer function method in Fourier optics was developed for the stepper used in these experiments. The efficiency vs. fill factor curve of several pitch designs was computed with aerial image calculation code, and it was found that a two dimensional square phase grating mask with two identical squares at the diagonal position of every square pitch produces rapidly changing efficiency curve. To vary the fill factor of this type of grating, the size of two squares are changed while their corner points remain fixed as shown in FIG. 9. By making the desired analog $0^{th}$ order efficiency a function of position on the mask plane, the fill factor also becomes a function of position on the mask. The fill factor determines the efficiency of this grating, and the duty cycle in the x or y direction is a useful quantity for designing the mask. For this type of grating, the fill factor F is related to duty cycle was the following formula where a is the pi phase area and Λ is the period.

$$F(w) = \frac{2a^2}{\Lambda^2} = 2w^2 \quad (11)$$

In order to derive the analytic expression for $0^{th}$ order efficiency of this phase grating, the amplitude at the grating plane was expressed in the following form.

$$t(x,y) = \left[2\text{rect}\left(\frac{x-a/2}{a}, \frac{y-a/2}{a}\right) + \right. \\ \left. 2\text{rect}\left(\frac{x-(\Lambda-a/2)}{a}, \frac{x-(\Lambda-a/2)}{a}\right) - 1\right] \otimes \frac{1}{\Lambda^2}\text{comb}\left(\frac{x}{\Lambda}, \frac{y}{\Lambda}\right) \quad (12)$$

Then the equation for the $0^{th}$ order efficiency, I(w), as a function of duty cycle (w=a/Λ) can be derived by taking Fourier transform of above expression and substituting zero spatial frequency, and the result is shown below.

$$I(w)=16w^4-8w^2+1 \text{ (for } w=0\sim0.5) \quad (13)$$

For the duty cycle greater than approximately 0.5, w should be replaced with 1-w in the above equation. The high slope of this curve for I(w) makes the fabrication of thick micro-optics profile easier, as one can produce a certain variation of efficiency within a small range of duty cycle. A duty cycle range of approximately 0.2 to approximately 0.5 was found to be optimal, with a cutoff period of approximately 2.5 μm.

Before designing the duty cycle function for the two-dimensional phase grating mask, the response of photo-resist to the exposure dose should be investigated. SPR-220 positive photo-resist was chosen for the fabrication of micro-optics because it works well with G-line exposure and allows thick films, up to approximately 12 μm, in a single spin step. The developed photo-resist versus exposure time curve of SPR-220 resist was obtained by performing a dose matrix exposure. The resist begins to respond to exposure at approximately 0.5 sec, and the developed depth rises rapidly after that amount of time. This behavior of the photo-resist is compensated for by using a blank bias exposure of approximately 0.5 sec. Then, one can expose the phase mask and form a desired analog resist pattern from the usable exposure region between approximately 0.5 sec and approximately 3.0 sec, resulting in approximately 5 to approximately 11 μm of total resist height, depending on mask design and initial resist thickness. This fact was verified by numerically convolving the exposure dose profile with the exposure characteristic curve of SPR-220. The normalized intensity curve I(w) as a function of duty cycle can be multiplied by exposure time to give the normalized exposed dose curve in the unit of exposed time. For this two step exposure, the dose profile is given by $$D(w)=I_0 \cdot T_b + I(w) \cdot T \quad (14)$$

In this equation, $I_0$ is the initial intensity (=1), $T_b$ is the bias time, and $T_e$ is the exposure time. Since the dose profile is normalized to exposure time, a numerical convolution can be performed by combining this curve with the exposure characteristic curve of SPR-220 resist. The bias time can be varied to optimize the resist profiles, however higher bias times result in a reduced remaining resist thickness.

When designing a two dimensional phase grating mask, numerous approaches were tested and shown to give similar results. One and two rectangles per pixel were tested, and it was found that the fill fraction determines the 0 h order intensity propagating through the system. The two dimensional design shown in FIG. 9, changes the filling fraction of each period by varying the pixel size of two pixels per period in both x and y.

Figure 10:
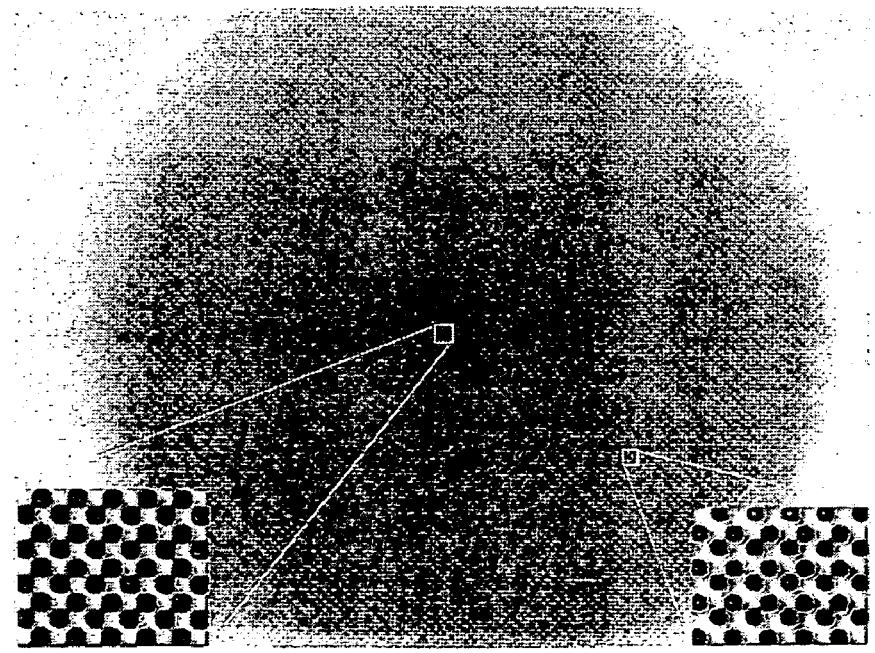
FIG. 10 is a microscope picture of the two dimensional grating for a positive micro-lens.

In order to fabricate the phase mask, a duty cycle map for the two-dimensional phase grating was designed with a approximately 2.5 μm period. A positive micro-lens with a diameter of approximately 100 μm and an approximately 100 μm square micro-prism were two of the features. For the positive micro-lens, the inverse spherical $0^{th}$ order intensity profile was used to obtain the duty cycle profile through equation (11). For the micro-prism a linearly increasing intensity profile was created and designed to correspond with the duty cycle profile. Fabrication techniques for the phase grating mask included projection and contact lithography and electron-beam direct write, which was found to create the best grating. The mask plate was coated with PMMA (polymethyl methacrylate) resist of pi phase thickness for g-line wavelength (approximately 436 nm). The mask was then exposed with a dose of approximately 450 μC/cm² at approximately 50 kV, followed by an approximately 60 sec developing in MIBK:IPA (methyl isobutyl ketone1:isopropyl alcohol 3) and an IPA rinse. FIG. 10 shows a microscope image of the two-dimensional phase grating pattern for the micro-lens.

To use the phase mask with a photolithographic stepper, a fused silica wafer was coated with approximately 11.6 μm thick SPR-220 resist. The wafer was then exposed with the phase mask. The exposure and bias time were chosen based on the numerical computation of the final resist profile. From numerical convolution computation, an approximately 0.6 sec to approximately 0.8 sec bias time followed by a subsequent exposure time of approximately 2.6 to approximately 2.9 sec was determined to result in approximately 7 to approximately 9 μm of pattern height. A total exposure dose of approximately 480 to approximately 550 mJ/cm² was delivered to the resist. Those parameters were optimized through several iterations. The exposed SPR-220 resist was developed using CD-26 developer for 4 minutes and the surface profile was measured using a Zygo white light interferometer. The final surface profile was found to be in good agreement with that of the numerical computation.

Figure 11A:
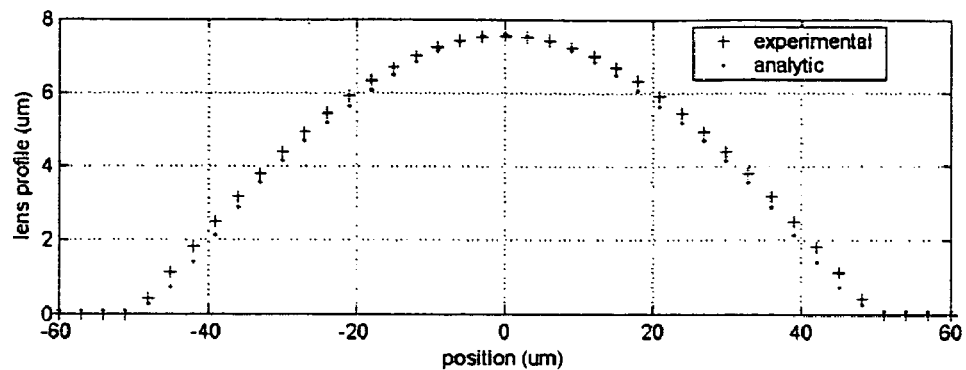
FIG. 11a shows a comparison of the experimental data (crosses) and analytical data (dots) for a lens profile.
Figure 11B:
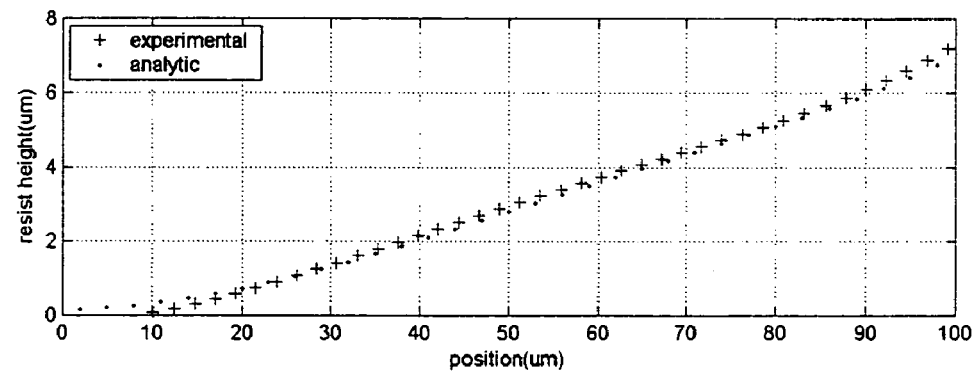
FIG. 11b shows a comparison of the experimental data (crosses) and analytical data (dots) for a prism profile.
Figure 12A:
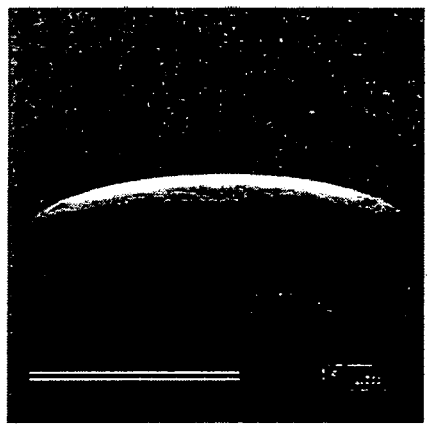
FIG. 12a is an SEM image of the micro-lens.
Figure 12B:
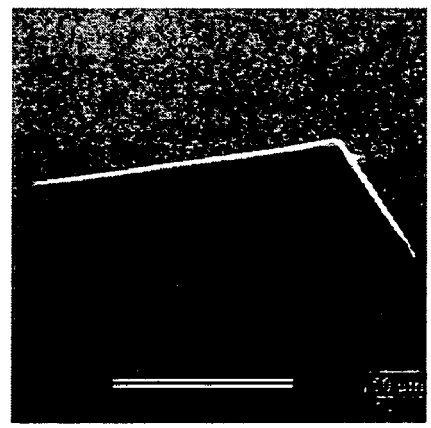
FIG. 12b is an SEM image of the prism.

In order to compare the surface profile of micro-lens with that of numerical computation, the resist surface profile of micro-lens was fit to an aspheric lens equation up to $O(r^4)$ order. The aspheric lens surface was then plotted with fitted parameters of curvature, conic constant, and the fourth order coefficient. For the numerical analysis, the final resist profile was computed by numerically convolving the dose profile with the exposure characteristic curve of SPR-220 resist. Finally, the one-dimensional surface profile from the numerical analysis was overlaid with the one-dimensional plot from the surface fitting of the micro-lens, as shown in FIG. 11a. The difference of the two plots is less than approximately 5% of the total thickness. This further demonstrates the accuracy of the numerical analysis method. By varying the bias and exposure time, the focal length of the micro-lens can be controlled within a range of approximately 200 to approximately 330 μm. A similar surface analysis was performed for the micro-prism, and it also shows good agreement between the experimental and numerically computed profile as shown in FIG. 11b. The quality of the surface was inspected using a scanning electron microscope. The surface topography can be seen in the scanning electron microscope (SEM) images of the positive lens, as shown in FIG. 12a, and prism, as shown in FIG. 12b. It was observed that the smoothness of the resist surface is very good as there were no apparent discrete surface levels. This shows that the phase mask of the present invention truly produces the analog resist profile as predicted from theoretical/numerical simulation.

The feasibility of using a two dimensional phase grating mask to fabricate an analog micro-optics profile in thick photo-resist was demonstrated. The phase grating, with two squares in every square pitch, produces a more rapidly changing $0^{th}$ order efficiency with changing fill factor than that of a one dimensional phase grating mask. With a period small enough to cut off the ±1 and higher orders, one can simply vary the fill factor in two directions on the mask plane to produce a desired analog intensity of arbitrary design. This property is ideal for fabricating analog photo-resist profiles with a photo-lithographic stepper system. This technique utilizes a blank bias exposure and only one exposure with the phase mask, eliminating the complicated steps and alignments associated with other techniques. The phase mask is also free from the edge scattering effect which occurs at the sharp boundary of the chrome and open region on half-tone masks. This technique has been demonstrated for a positive micro-lens and prism, but can be utilized for a plethora of other analog surfaces and structures. The ability to repeatedly fabricate micro-optical elements that match the numerical design with excellent surface quality was proven through this phase-mask technique.

Fabrication of thick analog profile with photo-resist is a difficult task in photolithography. In this embodiment of the present invention, we demonstrate that a binary phase grating photo-mask created using e-beam direct writing with appropriate period and duty cycle is able to manipulate the exposure illumination in an analog fashion, and can be used for the fabrication of desired analog micro-optics profile on the surface of thick photo-resist. By choosing a proper period and variation of duty cycle of the phase grating mask, a desired analog intensity of exposure illumination for the optical stepper can be created.

Utilizing the high resolution of most e-beam systems, it is possible to increase the discretization of the duty cycle variation, resulting in smoother and more dramatically sculpted surfaces. This enables the formation of a wide range of analog elements with various types and thicknesses of photo-resist. The numerical convolution of diffraction efficiency curve and resist exposure characteristics may be used to predict the final resist profile and also design appropriate duty cycle distribution for the binary phase grating. As a demonstration of this technology, a variety of micro-optical elements such as a positive lens, ring-lens, prism, and blazed grating were fabricated using a phase grating mask fabricated in PMMA e-beam resist directly written with a high resolution electron beam system.

In the micro-machining of micro-optics, a special technique is required to create continuous analog resist profiles for analog micro-optical elements such as micro-lenses and diffractive lenses. Historically, the binary square type of resist profile has been researched and optimized extensively for last twenty years in order to reach the highest possible level of resolution with the optical stepper of Deep UV wavelength. However, the development of fabrication techniques for large analog resist profile in a thick photo-resist has begun relatively recently.

In order to meet this challenge for analog resist profile, several new types of photo-masks have appeared such as gray-scale mask, half-tone mask, and binary phase mask for certain applications other than high resolution IC circuits. The gray-scale mask is exploiting continuously varying optical density in the special patented HEBS glass plate in order to form a continuous relief profile in the photo-resist. The gray-scale mask has two main drawbacks. One is high cost, and another is strict dependence on the optical density of the photo-resist being used. It is necessary to characterize the thickness of the resist in terms of the optical density for a specific exposure tool in order to design a proper optical density map on a gray-scale mask. Once a mask is designed for a specific type and thickness of material, it is unable to be appropriately used for anything else. Half-tone masks create analog optical transmittance by use of a square dot array representing continuous optical density. By varying the pixel density or size, half-tone masks are capable of creating analog optical transmittance for the incident exposure light. However, this technique suffers from the pixel aperture diffraction effect, and also requires the adjustment of pixel density for a specific exposure tool. Both the gray-scale and half-tone techniques are limited to a specific thickness of material due to depth of focus. A pure binary phase mask is sometimes used for fabricating high frequency sinusoidal gratings in the photo-resist with half period of mask. However, to date, the phase grating mask technique has not been used for creating analog intensities similar to those of gray-scale and half-tone masks.

In the present invention, a new phase mask technique is disclosed which allows for the fabrication of an analog micro-optic profile in thin and thick photo-resists. This technique is fundamentally different from the gray-scale and half-tone mask techniques in that it utilizes a phase function on the mask plane to create analog optical intensity on the wafer plane, while the other two techniques only exploit analog amplitude functions on the mask plane.

FIG. 14a illustrates the amplitude changes for a half tone mask and FIG. 14b shows a similar design, but with phase variation instead of amplitude for this phase mask technique. The amplitude change over several periods is illustrated in FIG. 15a, with the phase mask technique shown in FIG. 15b. FIGS. 14a-15b show the fundamental difference between the techniques, in that one is purely amplitude control and the other is phase. A phase mask is entirely transmitting as opposed to the half-tone and gray-scale masks. This phase grating design allows for smooth control of the intensity without the adverse effects, namely edge scatter, that the amplitude mask causes.

The potential of controlling the optical transmittance of the phase mask in a continuous fashion by changing the parameters of the binary phase grating was investigated. Using only the 0th order from the phase grating with a pi phase shift, the optical transmittance can be controlled by simply varying the duty cycle of the phase grating. This technique is a promising alternative to gray-scale and half-tone masking techniques in the field of analog photolithography in that it is highly cost effective and transferable into a typical photolithographic environment. The feasibility of this technique was investigated and demonstrated in a standard photolithographic environment.

The optimal phase mask is fabricated using an e-beam resist spun onto a blank reticle. The resist is then coated with a charge-prohibiting layer. This layer allows for exposure in an electron beam system. The mask is written directly using an electron beam, after which the charge-prohibiting layer is removed without affecting the exposed but undeveloped resist beneath it. This is followed by a processing step, and then potentially an etching step. The mask is ready for implementation into the stepper system for the fabrication of analog micro-elements if the proper resist thickness is used. Etching can be performed to fabricate a more permanent phase mask. It is also possible to use a charge-prohibiting layer beneath the resist, which may result in an additional etch step.

In this work, PMMA resist was used on a quartz reticle. This resist is transparent at the wavelength of the stepper system used for this experimental verification (436 nm). The PMMA was spun on at a thickness for a pi phase change. The after exposure on the ebeam and developing, a binary phase grating structure is apparent on the mask. For this work, the mask was then immediately utilized in the stepper system, as the pi phase shift was accommodated for in the thickness of the PMMA. If other e-beam resists are used, it may or may not be appropriate to transfer etch the binary phase grating into the substrate for the according pi phase thickness in the substrate. Without the etching step, it is possible to use the phase mask in the stepper for its necessary exposures, strip the resist off of the mask, recoat and expose new phase gratings for another application. This flexibility is another advantage of phase masks as opposed to amplitude masks.

Exposure Characteristic of SPR 220-7 Photo-Resist

In order to make a proper design of duty cycle of binary phase grating mask for the desired analog resist profile, the exposure response of thick photo-resist should be characterized in terms of the duty cycle of binary phase grating mask. The SPR 220-7 photo-resist can be spun to form approximately 7 to approximately 12 µm of thickness on fused silica wafer with good uniformity, and also it works well for both I (approximately 365 nm) and G-line (approximately 436 nm) exposure tools. It was spun on fused silica wafer at the thickness of approximately 12 µm and exposed with our GCA G-line stepper for exposure times of approximately 0.3 to approximately 3.6 sec in a dose matrix form on the wafer. This wafer was developed in MF CD-26 developer for 4 minutes.

The SPR 220-7 resist responds slowly to the delivered exposure energy until the exposure time reaches 0.5 sec and begins to rise rapidly past that time. From after 1.0 sec of exposure time, the slope of exposure curve is slightly reduced and maintains linear form until it reaches the saturation at around approximately 2.8 sec.

Because of this nonlinear response of the resist to the exposure dose, a proper amount of flat bias exposure is necessary prior to the exposure with phase mask. After this flat bias exposure without mask, the SPR 220-7 will respond to the delivered analog dose in a smooth, almost linear fashion. It is possible to numerically convolve the efficiency vs. duty cycle curve of the phase grating with the exposure curve in order to make a plot of remaining resist thickness vs. duty cycle resulting from the sequential bias exposure and the exposure through phase mask. This convolution plot is very useful for estimating the response of the resist to the duty cycle of phase grating mask. It also helps to determine a good range of duty cycle which has linear response in the resist profile.

In order to perform this numerical convolution, the scales of efficiency curve and exposure curve should be matched. The 0th order efficiency $DE(w)$ can be regarded as the intensity transmittance of exposure light, which is the ratio $I(w)/I_0$. If this quantity is multiplied by the exposure time t, it becomes the exposure dose normalized by the incident exposure light intensity. This quantity is essentially the exposure dose normalized to the exposure time. Since this normalized dose is on the exposure time scale, it matches the time scale on the exposure characteristic curve of resist. For the flat bias exposure time of $t_b$ and subsequent exposure time t through the phase grating mask. The normalized dose is given by $$D(w) = t_b + DE(w) \cdot t \quad (23)$$

Figure 13:
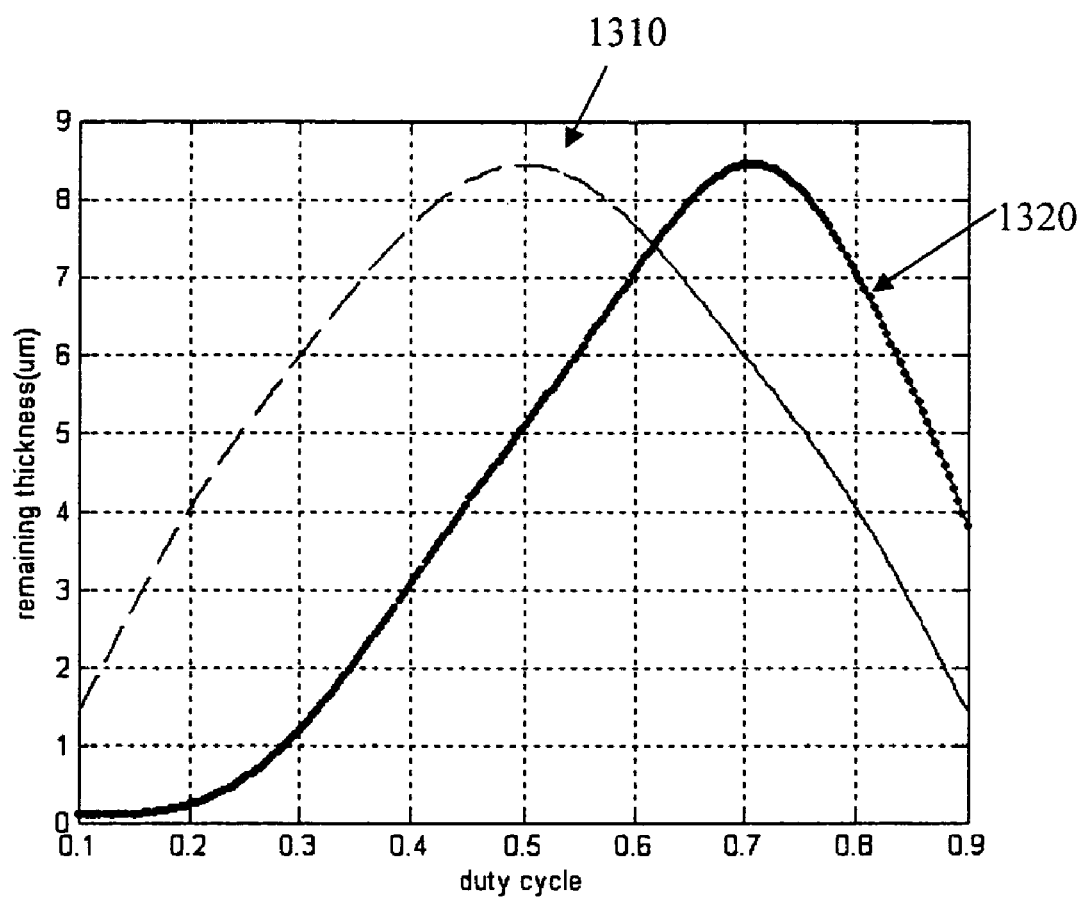
FIG. 13 shows the remaining thickness vs. duty cycle obtained by numerical convolution of the resist characterization curve with $0^{th}$ order efficiency curve for 0.6 sec of bias and 2.6 sec of exposure.

In the above expression the bias exposure time $t_b$ was multiplied by the flat incident transmittance of one. The next step is the polynomial curve fitting of the exposure characteristic curve. The developed depth d vs. exposure time t can be fitted to sixth order polynomial $d(t)$ of t. Once we have the coefficients for this sixth order polynomial, we can simply substitute the time variable with $D(w)$ of the equation (23) and it becomes the developed depth d vs. the duty cycle curve $d(w)$. The remaining resist curve $h(w)$ is simply the initial thickness minus the developed depth curve. FIG. 13 is the result of this convolution for approximately 0.6 sec of bias and approximately 2.6 sec of exposure with both one-dimensional 1310 and two-dimensional 1320 binary phase grating mask.

As shown in this curve, the two-dimensional phase grating mask 1320 makes more rapid variation of the remaining thickness with duty cycle than the one-dimensional phase grating mask 1310. This property makes the two-dimensional phase grating mask ideal for high sag micro-optics.

Design and Fabrication of Phase Grating Mask

In order to demonstrate the feasibility of this binary phase grating mask approach for the fabrication of analog micro-optics, a simple positive micro-lens and ring micro-lens of approximately 200 µm diameter was designed. The sag of the lens was chosen to be approximately 7.5 µm and the lens has approximately 0.5 µm of base thickness underneath it. From an optical viewpoint, this base thickness is redundant and is not necessary. But if the resist height goes to zero at the edge of the lens, the corresponding grating duty cycle on the mask would be almost zero which is practically impossible. Approximately 0.5 µm was selected as the minimum linewidth for the phase grating mask, which corresponds to approximately 0.15 of duty cycle for one-dimensional phase grating mask and approximately 0.18 of duty cycle for the two-dimensional phase grating mask. According to the convoluted remaining resist curve, this would result in approximately 0.5 µm of remaining resist. So, the lens was designed to sit on this much base thickness of resist.

This is a plano-convex type positive lens with the incident light coming from the plane side. For this type of lens, the radius of curve R and focal length f are calculated from the lens diameter D and sag s by the following simple formulae.

$$R = \frac{D^2/4 + s^2}{2s} \quad (24)$$

$$f = \frac{R}{n-1} \quad (25)$$

For the lens with diameter of approximately 200 µm and sag of approximately 7.5 µm, the focal length of the lens made in SPR-220 resist will be approximately 1050 µm at approximately 630 nm of wavelength. This makes the lens F-number of 5.25. The ring lens with diameter of approximately 200 µm, sag of approximately 7.5 µm will have much smaller focal length, because the width of the ring is half of the diameter which results in smaller radius of curvature. For the diameter of approximately 200 µm, the width of ring is approximately 100 µm, giving much shorter approximately 266 µm of focal length and 2.66 of F-number.

The desired resist height profiles for positive lens and ring lens can be analytically represented by the following expressions.

$$\text{Positive lens: } h(r) = R - \sqrt{R^2 - r^2}, \ (r<D/2) \quad (26)$$

$$\text{Ring lens: } h(r) = R' \sqrt{R'^2 - (r-D/4)^2}, \ (r<D/2) \quad (27)$$

In the above expression, R' is the radius of curvature of ring with sag s and width D/2. There are two approaches to the design of the duty cycle map of the binary phase grating for the fabrication of the desired resist profile. The first is to just start from the $0^{th}$ order grating transmittance profile that is of the reverse form as the desired resist profile. This is the simplest way of designing the duty cycle and it basically assumes that the response of resist to the exposure intensity is linear. For the spherical micro-lens profile like this example, the transmittance profile should be an inverted sphere form with the same diameter. From the transmittance profile I(x, y), the duty cycle map W(x, y) can be computed by solving the grating efficiency equation (19), (22) for W.

$$\text{1D grating mask: } W(x) = (1 - \sqrt{I(x)})/2 \quad (28)$$

$$\text{2D grating mask: } W(x,y) = \sqrt{(1 - \sqrt{I(x,y)})/2} \quad (29)$$

When designing the desired grating transmittance profile, it should be normalized properly to avoid the minimum duty cycle becoming too small to fabricate. For a one-dimensional grating mask, the maximum transmittance was normalized for approximately 0.15 of minimum duty cycle, and it was normalized for approximately 0.18 of minimum duty cycle for the two-dimensional grating mask.

The second approach is to use the numerical de-convolution method to find out the required dose profile with certain bias and exposure time, and compute the intensity, duty cycle profile from that dose profile. The desired resist height profile can be used to determine the required exposure dose profile to produce it using the polynomial fitting expression for exposure curve of SPR 220 resist. The exposure characteristic curve can represented by sixth order polynomial function D(h).

$$D(h) = a_0 + a_1 h + a_2 h^2 + a_3 h^3 + a_4 h^4 + a_5 h^5 + a_6 h^6 \quad (30)$$

This function basically gives the required dose value for a certain remaining resist height h. Again, this dose is normalized by the exposure time as previously explained. Thus, it is possible to substitute the resist height profile h(x, y) in the polynomial expression D(h) in order to obtain the desired dose profile D(x, y)=D(h(x, y)). Then, with a proper bias and exposure time to clear the SPR-220 resist, the desired dose profile can be used to compute the required transmittance profile by solving the equation (23) for I(x, y).

$$I(x,y) = (D(x,y) - T_b)/T_e \quad (31)$$

From the exposure curve of SPR 220-7, we determined the bias and exposure time to be approximately 0.6 sec, and approximately 2.6 sec respectively. Finally the duty cycle distribution W(x, y) can be obtained from the transmittance profile using the equations (28 and 29). The above expressions for duty cycle function are for lower duty cycle solutions of grating efficiency equations. For higher duty cycle solution, the minus sign in the equation should be changed to plus.

Fabrication of Micro-Optics Profile on the SPR 220-7 Resist.

Simple prism profiles were first fabricated, which is a linear ramp in resist profile. The size of the prism is approximately 100 µm square, and height is approximately 8 µm. Both transmittance and resist profile based two-dimensional phase grating mask design was used to fabricate this structure in SPR 220-7 resist. The target transmittance profile is a linear ramp of transmittance going from approximately 1.66% to approximately 75%. For the resist profile based phase mask design, the linearly ramping resist profile going from approximately 0.5 µm to approximately 8 µm of resist height was used. The duty cycle ranges from approximately 0.26 to approximately 0.66 for these designs.

Next, an approximately 200 µm positive micro-lens was fabricated using the two-dimensional binary phase grating mask designed from both the transmittance profile and the resist profile. For the transmittance profile-based phase mask design, an inverted sphere type profile with approximately 0.75 of transmittance at the edge of lens was used to generate duty cycle map using equation (29). The resist profile-based phase mask design was obtained from the sphere type profile with approximately 7.5 µm of sag height and approximately 0.5 µm of base resist thickness using the numerical de-convolution procedure explained previously. The range of intensity variation and duty cycle are the same as the prism cases.

An approximately 200 µm ring lens was also fabricated with the similar procedure as the positive micro-lens, but with a one-dimensional circular phase grating mask instead of the two-dimensional square phase grating. Since the one-dimensional grating mask makes smaller transmittance variation than the two-dimensional grating over the usable range of duty cycle, the sag height of the ring lens was designed to be approximately 5 µm. The transmittance variation range from the one dimensionsal grating mask is approximately 1.4% to approximately 50% and this corresponds to duty cycle range of approximately 0.15 to approximately 0.44.

In order to fabricate the positive micro-lens and ring-lens on the SPR 220-7 resist with the fabricated phase grating mask, a 4" fused silica wafer was coated with SPR 220-7 resist for the initial thickness of approximately 12 µm. This is the maximum thickness possible with SPR 220-7 resist when spun at approximately 1000 rpm with spin coater. Next, it was soft-baked on a hot plate at approximately 115° C. for approximately 90 seconds. A GCA g-line stepper was used to expose this wafer with the phase grating mask. The bias and exposure time were approximately 0.6 sec, approximately 2.6 sec as the duty cycle map on this mask was designed for that exposure condition. The exposed SPR 220-7 resist should be sitting at least approximately 45 minutes before the post-bake is applied. The post-exposure bake was done in the same way as the soft-bake. After the post-exposure bake was done and wafer cooled down, it was developed by immersing in MF CD-26 developer for approximately 4 minutes. Then, it was rinsed with de-ionized water and dried with nitrogen.

The Resist Profiles

In order to measure the surface profile of the fabricated analog elements on thick photo-resist, optical profilometry was used. A contact profilometry machine was not used because it could damage the photo-resist surface and also it is more limited in height measurement range. The developed resist profile was measured with Zygo white light interferometer. For the positive micro-lenses, Zygo can perform two dimensional surface fitting for a spherical surface with aspheric equation and 10th order polynomial of radius. The surface fitting to aspheric equation was used to obtain the radius of curvature and conic constant of positive micro-lenses. For other type of elements, one dimensional surface profiles through the center of elements were taken from the measured surface data. All these experimental surface profiles were compared with initial target resist profile from which the phase grating mask was designed.

In the fabrication of the phase grating mask for analog elements, the control of line-width and pixel size was very critical for making the exact analog surface as designed. The parameters affecting it include the e-beam dose and current, developing time for PMMA e-beam resist, and the initial thickness of PMMA resist. Those parameters were experimented with to make the phase mask with the exact duty cycle distribution as designed.

The electron-beam method of direct writing provides the capability to write the smallest square pixel of less than approximately 0.5 µm. Another advantage of electron-beam direct writing is that it allows making very small increments of pixel size. In order to make a smooth enough analog profile on the resist, the duty cycle increment should be approximately 0.01 or smaller. This corresponds to approximately 25 nm for approximately 2.5 µm period on mask. It is very hard or nearly impossible to achieve this level of pixel size variation using other photolithographic techniques. The low absorption of PMMA, extreme variability and rapid turn-around of e-beam direct writing are just a few more of the advantages surrounding this technique.

This technique is not limited to simple lenses and prisms, as illustrated earlier. FIG. 16 shows an SEM image of a blazed grating with a 10 µm period and approximately 10 µm depth fabricated in thick photo-resist. This steep and smooth topography is extremely difficult to fabricate using other techniques due to the depth of focus limitations. Similar steep or smooth profiles are very important for applications in FIG. 17 is an SEM image of a trihedral array. These small inverse pyramids are useful as retro-reflectors for numerous applications. It is apparent from this image that the pattern can be tightly packed on the mask, resulting in an efficient array on the wafer plane. For this specific array, the pattern was then again tiled on the wafer system to cover a large area, (greater than 2 inches). With a simple coating of nickel, this array is able to be integrated into a retro-reflecting setup for visible light, an advantage to overcoming the depth of focus issues in order to utilize thick photo-resists.

In order to maintain good repeatability of the analog resist profile from wafer to wafer, the process should be tightly controlled. The resist and developer should be always in good condition and within the expiration date prior to using it. Appropriate resist processing should be followed such as the baking condition and sitting time prior to next process. Also the stepper system should be maintained in good condition to ensure consistent exposure result. As for the mask fabrication, the PMMA resist process should be well controlled to avoid any incorrect grating shape on the phase mask. Once proper electron-beam dose and PMMA resist developing time is determined, the resist and developer should be kept in proper condition and the resist process should be done in a consistent manner. This requirement on process control is tight, but not difficult to maintain. Thus, this analog resist profile fabrication process using the phase grating mask is easily transferable to product manufacturing environment.

A phase mask technique based on electron-beam direct writing has been demonstrated which is potentially a good alternative to gray-scale and half-tone mask technique for the fabrication of analog resist profiles. The principle of this technique is that the zeroth order efficiency of binary phase grating of pi phase depth depends on the duty cycle of grating. By using a small enough grating period, it is possible to allow only zeroth order light to pass through the stepper system to form an aerial image on the wafer. The numerical convolution of zeroth order diffraction efficiency and exposure characteristic curve of the thick resist was used to predict the response of the resist height to the duty cycle variation of phase grating mask under particular exposure conditions. This numerical computation agrees well with the experimental results on the SPR 220 resist. A numerical de-convolution technique was developed to compute the required duty cycle variation for certain analog resist profiles to be made on a thick resist. This approach is simple and only the diffraction efficiency curve and exposure characteristic curve of particular resist are needed. The phase grating mask design based on this numerical de-convolution of target resist profile proved to yield a more accurate analog resist profile than the simple transmittance profile based phase grating mask design.

Due to the very high resolution of the Leica 5000+EBPG system, fine variation of the line-width and pixel sizes were able to be produced on a binary phase grating mask used for micro-sculpting in a projection system. PMMA electron-beam resist was used to form the phase grating with varying duty cycle on the mask because of its high transmittance at g-line and chemical durability. An analog micro-lens, prism, and a ring-lens were fabricated on SPR 220-7 resist in order to verify the feasibility of this technique. But this technique can be applied to other types of both thin and thick photo-resists and is not limited to SPR 220-7 resist. The fabricated analog resist elements can be followed by a dry etching process to transfer the analog resist profile to the substrate.

Using this technique, it is possible to remove an entire processing step from the fabrication of the analog micro-optics. There is no longer a need for two masks (one chrome and one phase), but instead a single mask is written and then utilized in the stepper, which in turn increases the repeatability and accuracy of this technique. The turnaround time for design to fabrication of the optics is also dramatically impacted. This technique also eliminates the issues associated with the projection and contact lithography, such as minimum feature size and pattern quality.

Another advantage of this technique is the relative ease at which e-beam resist can be coated to the necessary thickness, as opposed to the thinning procedures required for most photo-resists.

While the invention has been described, disclosed, illustrated, and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method for micro-sculpting in an optical image reduction machine comprising the steps of:
    selecting a photo-active material for fabricating a pre-selected micro-element;
    selecting a duty cycle that translates to image a desired variable analog optical intensity pattern as a height variation on a surface of the selected photo-active material, wherein a developed photo-active material depth is a nonlinear function of exposure;
    determining an analog intensity for a profile of the pre-selected micro-element;
    creating a binary pi phase grating photo-mask on a transparent reticle according to the profile of the pre-selected micro-element using the determined variation in duty cycle;
    providing a layer of the selected photo-active material on one single side of a target substrate;
    directly exposing said selected photo-active material on the one single side of the substrate by transmitting only one single radiation to said selected photo-active material through said pi phase grating photo-mask that transmits said radiation with a transmittance proportional to the period and duty cycle of said pi phase grating photo-mask to allow only a 0th order diffracted radiation from the pi phase grating photo-mask with a pi phase shift to control an optical transmittance by varying the duty cycle of the phase grating to develop said selected photo-active material; and
    processing said selected photo-active material to form the variable intensity pattern in said developed photo-active material that corresponds to the optical transmittance of said pi phase grating photo-mask.

2. The method according to claim 1, wherein said surface relief structure in said photo-active material has a continuous analog topography.

3. The method according to claim 1, wherein said binary pi-phase grating photo-mask is a binary n pi-phase grating photo-mask where n is any integer.

4. The method according to claim 1, wherein said binary pi-phase grating varies in one dimension.

5. The method according to claim 1, wherein said binary pi-phase grating varies in two dimensions.

6. The method according to claim 1, wherein creating comprises creating said binary pi-phase grating photo-mask in an image reduction machine.

7. The method according to claim 6, wherein the image reduction machine is a stepper.

8. The method according to claim 1, wherein creating comprises creating said binary pi-phase grating photo-mask by contact exposure.

9. The method according to claim 1, wherein creating comprises creating said binary pi-phase grating photo-mask by electron beam direct writing.

10. The method according to claim 1, wherein creating comprises creating said binary pi-phase grating photo-mask by direct laser writing.

11. The method according to claim 1, wherein creating comprises creating said binary pi-phase grating photo-mask by etching into the mask substrate.

12. The method according to claim 1, wherein creating comprises creating said binary pi-phase grating photo-mask by micro-molding.

13. The method according to claim 1, wherein said layer of photo-active material has a thickness greater than approximately 100 nm and less than approximately 25 μm.

14. The method according to claim 1, wherein exposing comprises exposing said photo-active material by zero order diffraction radiation.

15. The method according to claim 1, wherein exposing comprises exposing said photo-active material in an image reduction machine.

16. The method according to claim 2, further comprising etching said processed photo-active material and target substrate to form a surface relief structure in the target substrate that corresponds to the surface relief structure in said processed photo-active material.

17. The method according to claim 16, wherein etching comprises etching said processed photo-active material by a dry etching process.

18. The method according to claim 16, wherein etching comprises etching said processed photo-active material by a wet etching process.

19. The method according to claim 1, further comprising the step of replicating designs across said photo-mask whereby arrays of patterns are created in said photo-active material.

20. The method according to claim 1, further comprising the step of repeating said exposing step using multiple phase-masks.

21. The method according to claim 1, wherein said micro elements are refractive and diffractive micro-optical elements selected from the group consisting of prisms, cylindrical lens, positive micro-lens, and negative micro-lens.

22. The method according to claim 1, wherein said micro-elements are three-dimensional micro structures.

23. The method according to claim 1, further comprising the step of repeating said creating step, said providing step, said exposing step, and said processing step.

24. The method according to claim 1, wherein the transparent reticle is a transparent quartz reticle.

25. The method according to claim 1, wherein the photo-active material is photo-resist.

26. The method according to claim 1, wherein the photo-active material is sol-gel.

27. The method according to claim 1, wherein the creating a phase grating photo-mask on a transparent reticle is on both sides of said transparent reticle.

28. A method for micro-sculpting consisting essentially of the steps of:
- selecting a photo-active material for fabricating a pre-selected micro-element;
- determining how a variation in duty cycle translates to image a desired variable analog optical intensity pattern as a height variation on a surface of the selected photo-active material by calculating a duty cycle function $D(x+y)$ for a resist height profile according to $D(x+y)=w(h(x,y))$, wherein a developed photo-active material depth is a nonlinear function of exposure;
- determining an analog intensity for a profile of the pre-selected micro-element;
- creating a binary pi phase grating photo-mask on one or both sides of a transparent reticle, wherein the binary pi phase grating photo-mask is created according to the profile of the pre-selected micro-element using the calculated duty cycle function;
- providing a layer of photo-active material on one single side of a target substrate;
- directly exposing said photo-active material on the one single side of the target substrate by transmitting only one single radiation to said photo-active material through said binary pi phase grating photo-mask that transmits said only one singe radiation with a transmittance proportional to the period and duty cycle of said binary pi phase grating photo-mask to allow only a 0th order diffracted radiation from the binary pi phase grating photo-mask to develop said selected photo-active material; and
- processing said photo-active material to form a surface relief structure in said developed photo-active material that corresponds to the optical transmittance of said pi phase grating photo-mask.

29. The method of claim 28, wherein creating a pi phase-grating photo-mask is by electron-beam direct writing.

30. The method of claim 28, wherein creating a pi phase-grating photo-mask is by direct laser writing.

31. The method of claim 28, wherein creating a pi phase-grating photo-mask is by micro-molding.

\* \* \* \* \*